(12) United States Patent
Gotsmann et al.

(10) Patent No.: US 9,640,748 B2
(45) Date of Patent: May 2, 2017

(54) THERMAL OSCILLATOR

(71) Applicant: International Business Machines Corporation, Armonk, NY (US)

(72) Inventors: Bernd Gotsmann, Rueschlikon (CH); Fabian Menges, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/894,824

(22) PCT Filed: May 13, 2014

(86) PCT No.: PCT/IB2014/061403
§ 371 (c)(1),
(2) Date: Nov. 30, 2015

(87) PCT Pub. No.: WO2014/191859
PCT Pub. Date: Dec. 4, 2014

(65) Prior Publication Data
US 2016/0112050 A1    Apr. 21, 2016

(30) Foreign Application Priority Data
May 31, 2013  (GB) .................................. 1309754.8

(51) Int. Cl.
*H01L 37/02*     (2006.01)
*F28F 13/00*     (2006.01)
(Continued)

(52) U.S. Cl.
CPC .............. *H01L 37/02* (2013.01); *F28F 13/00* (2013.01); *H01L 37/04* (2013.01); *H01L 41/113* (2013.01);
(Continued)

(58) Field of Classification Search
CPC  H03B 1/00; H01L 23/24; H01L 37/02; H01L 37/04; H01L 35/02; H01L 35/00;
(Continued)

(56) References Cited

U.S. PATENT DOCUMENTS 4,044,558 A    8/1977   Benson
5,467,059 A    11/1995  Zwack
(Continued)

FOREIGN PATENT DOCUMENTS

CN       1092919 A     9/1994
CN     101587881 A    11/2009
(Continued)

OTHER PUBLICATIONS

Biehs et al., "Influence of roughness on near-field heat transfer between two plates", The American Physical Society, Physical Review B 82, 245410, Dec. 2010, pp. 245410-1-245410-8.
(Continued)

*Primary Examiner* — Ryan Johnson
(74) *Attorney, Agent, or Firm* — Scully, Scott, Murphy & Presser, P.C.; Keivan Razavi, Esq.

(57) ABSTRACT

A thermal oscillator (10) for creating an oscillating heat flux from a stationary spatial thermal gradient between a warm reservoir (20) and a cold reservoir (30) is provided. The thermal oscillator (10) includes a thermal conductor (11) which is connectable to the warm reservoir (20) or to the cold reservoir (30) and configured to conduct a heat flux from the warm reservoir (20) towards the cold reservoir (30), and a thermal switch (12) coupled to the thermal conductor (11) for receiving the heat flux and having a certain difference between two states (S1, S2) of thermal conductance for providing thermal relaxation oscillations such that the oscillating heat flux is created from the received heat flux.

20 Claims, 7 Drawing Sheets

(51) Int. Cl.
*H01L 35/00* (2006.01)
*H01L 37/04* (2006.01)
*H01L 41/113* (2006.01)
*H03L 1/02* (2006.01)

(52) U.S. Cl.
CPC ............ *H03L 1/02* (2013.01); *C01P 2006/32* (2013.01); *F28F 2013/008* (2013.01); *H01L 35/00* (2013.01)

(58) Field of Classification Search
CPC ...... F28F 13/10; F28F 13/00; F28F 2013/001; F28F 2013/008; F28F 2260/02; F28F 2260/00; C01G 31/02; C01P 2006/32; G05D 23/01; G05D 23/192; H02N 10/00
See application file for complete search history.

(56) References Cited

U.S. PATENT DOCUMENTS

| | | | |
|---|---|---|---|
| 5,644,184 | A | 7/1997 | Kucherov |
| 6,518,847 | B1 | 2/2003 | Sauer |
| 7,920,032 | B2 | 4/2011 | Makinwa et al. |
| 8,030,112 | B2 * | 10/2011 | Hsieh ................ B81C 1/00246 257/E21.499 |
| 8,324,783 | B1 | 12/2012 | Kumar |
| 8,519,595 | B2 | 8/2013 | Hunter et al. |
| 2009/0212875 | A1 | 8/2009 | Makinwa et al. |
| 2011/0169372 | A1 * | 7/2011 | Lim ........................ H02N 10/00 310/307 |
| 2011/0298333 | A1 | 12/2011 | Pilon |
| 2012/0056504 | A1 | 3/2012 | Hunter et al. |

FOREIGN PATENT DOCUMENTS

| | | |
|---|---|---|
| EP | 1 684 414 A1 | 7/2006 |
| WO | WO 2006/132531 A1 | 12/2006 |
| WO | WO 2012/025137 A1 | 3/2012 |

OTHER PUBLICATIONS

Lo et al., "Thermal transistor: Heat flux switching and modulating", arXiv:08032942v1 [cond-mat.stat-mech] Mar. 20, 2008, Journal of the Physical Society of Japan 77(5), Apr. 2008, pp. 1-5.
Rahafrooz et al., "Fully Micromechanical Piezo-Thermal Oscillators", Electron Devices Meeting (IEDM), 2010 IEEE International, Dec. 6-8, 2010, pp. 7.2.1-7.2.4.
International Search Report and Written Opinion, PCT/IB2014/061403.
Rahafrooz et al., "Fully Micromechanical Piezo-Thermal Oscillators", Electron Devices Meeting (IEDM), 2010 IEEE International, Dec. 6-8, 2010, pp. 7.21-7.2.4.
International Search Report and Written Opinion, PCT/IB2014/061403, issued Nov. 30, 2015.

* cited by examiner

THERMAL OSCILLATOR

FIELD OF THE INVENTION

The invention relates to a thermal oscillator and to a device including at least one thermal oscillator.

BACKGROUND

A conventional thermal oscillator is described in document U.S. Pat. No. 4,044,558 A.

Document U.S. Pat. No. 7,920,032 B2 shows an oscillator device based on thermal diffusion. The oscillator is adapted for generating an oscillator signal. The oscillator device has at least a first heater, a temperature sensor, signal processing means, and a voltage controlled oscillator. An output of the temperature sensor is connected to an input of the signal processing means; an output of the signal processing means is connected to an input of the voltage controlled oscillator. An output of the voltage controlled oscillator in a first feedback-loop has a first connection to an input of the at least one first heater. The voltage controlled oscillator, in use, is capable of generating an oscillator signal, the oscillator signal being provided as heating drive signal to the at least one first heater over the first connection, and the signal processing means are capable of providing a signal for altering a frequency of the oscillator signal, wherein the signal processing means are arranged to implement the function of a synchronous demodulator.

U.S. Pat. No. 6,518,847 B1 shows an apparatus and a method for a thermal feedback oscillator. The apparatus may be directed to produce an oscillation frequency utilizing a thermal heat transfer characteristics of a semiconductor material. The thermal oscillator includes a heat circuit that is arranged to selectively produce a heat signal in response to the output signal. A reference circuit is arranged to produce a reference signal. A thermal sensor circuit is arranged to produce a sense signal in response to the heat signal and the reference signal. A comparator circuit is arranged to produce the output signal in response to the sense signal such that the output signal oscillates between two signal levels at the oscillation frequency, wherein the oscillation frequency is determined by a time constant associated with the heat transfer characteristics of the semiconductor material.

In reference [1], a thermal transistor is described which is adapted for heat flux switching and modulating. The thermal transistor is an efficient heat control device which can act as a heat switch as well as a heat modulator. In reference [1], one-dimensional and two-dimensional thermal transistors are described. In particular, it is shown how to improve the efficiency of the one dimensional thermal transistor significantly.

In reference [2], the influence of surface roughness on near-field heat transfer between two plates is described. In particular, a surface roughness correction to the near-field heat transfer between two rough bulk materials is discussed by using second-order perturbation theory. The results allow for estimating the impact of surface roughness to the heat transfer between two plates and between a microsphere and a plate, using the Derjaguin approximation. Furthermore, it is shown that the proximity approximation for describing rough surfaces is valid for distances much smaller than the correlation length of the surface roughness even if the heat transfer is dominated by the coupling of surface modes.

Document US 2012/0056504 A1 shows a MEMS based (MEMS; micro-electro-mechanical system) pyroelectric thermal energy harvester. The pyroelectric thermal energy harvester is adapted for generating an electric current. It includes a cantilevered layered pyroelectric capacitor extending between a first surface and a second surface, where the first surface includes a temperature difference from the second surface. The layered pyroelectric capacitor includes a conductive, bimetal top electrode layer, an intermediate pyroelectric dielectric layer and a conductive bottom electrode layer. In addition, a pair of proof masses is affixed at a distal end of the layered pyroelectric capacitor to face the first surface and the second surface, wherein the proof masses oscillate between the first surface and the second surface such that a pyroelectric current is generated in the pyroelectric capacitor due to temperature cycling when the proof masses alternately contact the first surface and the second surface.

Document EP 1,684,414 A1 describes a MEMS oscillator drive. The MEMS oscillator drive includes a device layer and sacrificial layers. The device layer and the sacrificial layers have relative high and low thermal conductivities, resulting in induced radial heat flux from the heat sources. The heat is conducted to the edge of the cantilever, where the sacrificial layer ends. Partial deformation appears to take place at the edge of the sacrificial layer, causing actuation of the released cantilever. This type of driving mechanism appears to occur with a laser heating source of low energy, such as approximately 102 uW, and long periods of sinusoidal excitation, such as approximately 50 to 300 ns. With such types of excitation energies, the driving mechanism appears to be primarily thermal in nature, while acoustic wave related phenomena are minor.

Accordingly, it is an aspect of the present invention to provide an improved thermal oscillator.

BRIEF SUMMARY OF THE INVENTION

According to an embodiment of a first aspect, a thermal oscillator for creating an oscillating heat flux from a stationary spatial thermal gradient between a warm reservoir and a cold reservoir is suggested. The thermal oscillator comprises a thermal conductor and a thermal switch. The thermal conductor is connectable to the warm reservoir or to the cold reservoir and is configured to conduct a heat flux from the warm reservoir towards the cold reservoir. The thermal switch is coupled to the thermal conductor for receiving the heat flux and has at least two different states of thermal conductance for providing thermal relaxation oscillations such that the oscillating heat flux is created from the received heat flux.

The thermal conductor combined with the thermal switch can form a solid-state thermal oscillator that creates an oscillating heat flux (alternating current) from an available stationary spatial thermal gradient (direct current). In particular, the thermal oscillator may be a self-sustaining device without mechanical moving parts that requires no active control advantageously. The thermal oscillator may have a certain difference between its two states of thermal conductance.

The underlying physical mechanism is based on alternating phase transitions leading to thermal relaxation oscillations between the two states of thermal conductance, which create said oscillating heat flux from the direct heat flux as provided by the warm reservoir, e.g. a heat source. The thermal oscillator according to embodiments of the invention may be considered as an analog to an electronic relaxation oscillator. The thermal oscillator may have numerous applications, as the technical creation and utilization of a non-stationary, alternating heat flux is applicable to technical systems operating in response to periodic temperature variations, like energy-harvesting devices, sensing devices, switching devices or clocking devices. Self-sustaining thermal oscillations directly allow modulating any subsequent temperature dependent properties, e.g. electrical, magnetic, optical and mechanical effects of materials in thermal contact, e.g. via radiation, conduction or convection.

According to embodiments the thermal switch is an element that changes its thermal conductance as a function of temperature between two states in a step-like manner, for example as consequence of a material phase change in a small temperature interval. For example, the thermal switch is made from a material showing metal-insulator phase transitions, such as vanadium dioxide. In particular, the phase change may be tunable, for example around 333 K. The switching material itself may show said difference in thermal conductance between the two states. In the example of vanadium dioxide, this difference is moderate, i.e. factor 2.

For example, the warm reservoir may be embodied as a warm or hot bath. In an analogous way, the cold reservoir may be embodied by a cold bath.

Depending on the application, the thermal conductor may be an active device. For example, the thermal conductor may include a pyroelectric material which is configured for energy-harvesting upon cycling its temperature. If an oscillating temperature source is needed, one end of the thermal conductor or the thermal switch may be attached to a thermal electrode.

In an embodiment, the thermal switch is sandwiched between the thermal conductor and a further thermal conductor, so that the thermal oscillator particularly consists of a series of a thermal conductor connected to both the warm reservoir and the thermal switch, and the further thermal conductor connected to both the cold reservoir and the thermal switch The sandwich of the thermal switch between two thermal conductors may be advantageous for adjusting the temperature profile in the thermal oscillator.

The two thermal conductors are attached between two temperature baths, for example. The thermal conductors show a much smaller dependence of thermal conductance on temperature than the thermal switch. In this embodiment, the switching temperature interval can be chosen freely between the temperatures of the warm and cold reservoir through suitable choice of the magnitude of thermal conductance of the first and second conductor.

In a further embodiment, the thermal oscillator is embodied as a solid-state thermal oscillator.

Advantageously, the solid-state thermal oscillator has not to be controlled actively. An electronic equivalent to said solid-state thermal oscillator may be a relaxation oscillator.

In a further embodiment, a vacuum gap is arranged between the thermal conductor and the thermal switch, in particular in such a way that heat transfer by thermal radiation is dominant over thermal conduction via potential gas molecules. Here, vacuum may include a rarefied gas that has a thermal conductance through the gas molecules on the same order or preferably smaller than the electro-magnetic thermal radiation.

For example, the vacuum gap has a width between 1 nm and 200 nm to promote thermal near-field heat transfer.

According to further embodiments the switching of thermal conductance is enhanced by the combination of the metal-insulator transition of the thermal switch with the thermal near-field radiation across the vacuum gap or vacuum layer. In one embodiment, the thermal conductor is an electrical insulator. The thermal conductance through the vacuum layer between the thermal conductor and the switch in its electrically insulating state is several times, e.g. 100 times, larger than the conductance through the vacuum layer between the thermal conductor and the switch in its electrically conducting state. The width of the vacuum gap is preferably on the order of tens of nanometers. The thermal conductance across a vacuum gap as a function of separation between vanadium dioxide and silicon oxide was calculated for the two different states in literature, see reference [3].

For the example of vanadium dioxide as the material for the thermal switch and silicon dioxide as the material for the thermal conductor, the thermal transmission through the vacuum gap of 10 nm decreases by a factor of 100 upon switching the vanadium dioxide from its first state (metallic) to its second state (electrically insulating), although the thermal conductivity of the thermal switching layer is slightly increasing by the factor of two. In this case, the variation of conductance through the vacuum gap is larger than the variation of conductance through the thermal switch. Therefore, the thermal switch can either be connected directly to the cold reservoir, or to a further conductor.

In a further embodiment, the said vacuum gap is sandwiched between the thermal switch and a thermal conductor in a metallic state. In this case, the thermal conductance of the vacuum gap is larger when the thermal switch is in its electrically conducting state as compared to the case of the switch being in its electrically insulating state. In this case, the thermal conductor is preferably connected to either the hot reservoir or to a first conductor.

In a further embodiment, the thermal switch is configured to switch at a first switching temperature from a first state of the two states in which the thermal switch has a first thermal conductance to a second state of the two states in which the thermal switch has a second thermal conductance. Further, the thermal switch is configured to switch at a second switching temperature from the second state to the first state.

In a further embodiment, the thermal switch is configured such that its two different states of thermal conductance are adapted to provide periodic metal-insulator phase transitions leading to the thermal relaxation oscillations such that the oscillating heat flux is created from the received heat flux.

Thus, the combination of the thermal conductor and the thermal switch to a thermal oscillator leads to thermal relaxation oscillations such that the oscillating heat flux is created from the received heat flux. Such oscillation can for example be based on alternating metal-insulator phase transitions.

For example, the first thermal conductance corresponds to a higher thermal conductivity of a metallic state and the second thermal conductance corresponds to a lower thermal conductivity of an insulating state.

In a further embodiment, the first and the second switching temperatures of the thermal switch lie between the temperature of the warm reservoir and the temperature of the cold reservoir. In particular, a switching material of the thermal switch is selected such that the first and the second switching temperatures lie between the temperature of the warm reservoir and the temperature of the cold reservoir.

Thus, the switching temperatures of the switching material of the thermal switch are between the temperatures of the two reservoirs. Furthermore, for a large temperature swing, the thermal conductance of the thermal conductor may be between the magnitudes of the thermal conductance of the thermal switch in its two states.

In general embodiments, the temperature of the warm reservoir is just higher than the temperature of the cold reservoir. According to a preferred embodiment the temperature of the cold reservoir is between 0 degree Celsius and 25 degree Celsius and the temperature of the warm reservoir is between 35 degree Celsius and 200 degree Celsius. These temperature ranges provide the advantage that they offer the possibility to use or reuse heat as warm reservoir that is broadly available and so far often not used/reused and just wasted. This may be denoted as a waste heat application. As an example, the human body or electronic devices such as mobile phones and computers may be used as a warm reservoir for these preferred temperature ranges and the ambient or room temperature may be used as cold reservoir.

According to further embodiments high temperature applications with a temperature range of the warm reservoir between 200 degree Celsius and 600 degree Celsius may be envisaged.

In a further embodiment, the thermal switch is configured to undergo the periodic metal-insulator phase transitions in time intervals which are smaller than a thermal equilibration time or thermal time constant of the thermal conductor, preferable smaller than nanoseconds.

In a further embodiment, the thermal switch has a state of larger thermal conductance at temperatures above the switching temperature interval, and a state of lower thermal conductance at temperatures below the switching temperature interval. In this case, the switch is preferably connected to the cold reservoir, and the thermal conductor is connected to both the switch and the hot reservoir.

In a further embodiment, the thermal switch has a state of smaller thermal conductance at temperatures above the switching temperature interval, and a state of larger thermal conductance at temperatures below the switching temperature interval. In this case, the switch is preferably connected to the hot reservoir, and the thermal conductor is connected to both the switch and the cold reservoir.

In a further embodiment, a switching material of the thermal switch is configured to have single domain behaviour during the phase transitions. In this regard, the switching material of the thermal switch has a thickness which is smaller than 100 nm. In particular, the switching material has a thickness between 10 nm and 100 nm.

In a further embodiment, a lateral dimension of the switching material and/or the thermal conductors is restricted such that single domain behaviour during the phase transitions is ensured. Lateral geometrical restrictions may additionally be used for thermal impedance matching. The requirements for the application may be such that a certain maximum heat flux between the warm and the cold reservoir through the thermal oscillator can be tolerated to maintain the temperature difference. At the same time, the materials of choice of the switch and the thermal conductors have a given thermal conductivity. With a suitable choice of the cross-section-length ratio, the thermal conductance of the thermal switch or the thermal conductors can be tuned.

Recapitulating the above three embodiments, the entire switching material, e.g. vanadium dioxide, of the thermal switch undergoes a phase transition in very short time intervals, e.g. picoseconds or nanoseconds, instead of gradually throughout the switching layer. Thus, it can be ensured that the thermal oscillator never finds a stationary state. So, the thermal oscillator swings between its two states for providing said oscillating heat flux. Thus, the switching material shows a single domain behavior during its phase transition leading to a step-like response in thermal conductance versus temperature dependence. For the example of vanadium dioxide as the material for the thermal switch, this happens if the layer of the thermal switch is thin, for example between 10 nm to 100 nm with a crystallographic c-axis orientation in parallel to the incident heat flux direction. Furthermore, the lateral dimension of the active switching layer of the thermal switch may be restricted to avoid the formation of a multi-phase system within the lateral direction of the film. By applying these geometrical restrictions, e.g. tuning area and thickness of the switching material, single-phase behavior of the phase change layer of the thermal switch can be ensured.

Moreover, the oscillation frequency depends on the thermal capacitances of the thermal switch and the thermal conductors. To optimize both, the magnitude of the temperature swing and the oscillation frequency, the geometries of the different layers may be adjusted. For example, the thermal resistance scales with length over cross-sectional area, while the thermal capacitance scales with the product of length and cross-sectional area.

In a further embodiment, the thermal conductance of the thermal conductor is between a first magnitude of thermal conductance of the thermal switch in its first state and a second magnitude of thermal conductance of the thermal switch in its second state.

In a further embodiment, the thermal conductor includes a pyroelectric material configured for energy harvesting upon cycling its temperature.

In a further embodiment, a thermal electrode is attached to the thermal conductor or the thermal switch such that the created oscillating heat flux is receivable at an external device. A thermal electrode is a body attached to the thermal oscillator, which allows connecting the temperature field or deviating thermal flux to a body or device of interest. For example, a thin metal stripe of high thermal conductivity and low heat capacitance, for example copper, may act as such a thermal electrode.

In a further embodiment, the thermal conductor has a plurality of spacers for defining a certain distance to the thermal switch.

In a further embodiment, the thermal switch includes at least one of the following switching materials: vanadium (II)-oxide, titanium-doped vanadium(III)-oxide, silicon-phosphor, silicon-arsenic, silicon-boron, and silicon gallium. In particular, the thermal switch is made from a material showing metal-insulator phase transitions, such as vanadium dioxide. In particular, the phase change temperatures may be tunable, for example around 333 K. The switching material itself may show a difference in thermal conductivity between the two states. In the example of vanadium dioxide, this difference is moderate, i.e. factor 2.

Depending on the application, the thermal conductor may be an active device. For example, the thermal conductor may include a pyroelectric material which is configured for energy-harvesting upon cycling its temperature. If an oscillating temperature source is needed, one end of the thermal conductor or the thermal switch may be attached to a thermal electrode.

As a switching material, vanadium dioxide may be an adequate material. Its switching temperature is slightly above room temperature, about 333 K, and tunable in a certain range. This makes it suitable for energy-harvesting applications using low temperature reservoirs, such as from waste heat sources. The preferred thickness is in the nanometer range to endure spontaneous switching of the entire film of the vanadium dioxide. Furthermore, other possible materials exhibiting Mott transitions are listed in reference [4].

In a further embodiment, the thermal conductor facing vanadium dioxide includes silicon dioxide to promote phonon polaron assisted near-field heat transfer across a vacuum gap.

According to some implementations, the phase transition of the thermal switch may not be a metal-insulator transition. Other phase transitions are possible that lead to step-like variations of thermal conductance when crossing the transition temperatures.

Further, according to some implementations, the switching direction may be inverted by replacing the thermal conductor, e.g. silicon dioxide, facing the phase change material, e.g. vanadium dioxide via the vacuum gap, by a metal, for example gold. In that case, the thermal conductor contacts the cold reservoir.

Any embodiment of the first aspect may be combined with any embodiment of the first aspect to obtain another embodiment of the first aspect.

According to an embodiment of a second aspect, a device is suggested which includes at least one thermal oscillator of the above discussed first aspect.

In an embodiment, the device is embodied as an energy harvesting device. Energy converters based on pyroelectric effects hold the promise to outperform existing thermal electric energy converters (see reference [1]) in terms of energy conversion efficiency. The present thermal oscillator may enhance said efficiency, because the conversion principle of such an energy converter is based on temporary changes in temperature which may be provided by said thermal oscillator. By means of said present thermal oscillator for creating temperature oscillations, the efficiency of converters based on pyroelectric, pyromagnetic or piezoelectric effects may be boosted.

In an embodiment, the device is embodied as a sensing device. The creation of an oscillating heat source as created by the present thermal oscillator may enhance the sensitivity of a thermal sensing device, e.g. in calorimetry. By means of the present thermal oscillator, the overhead of producing oscillating heat sources may be limited. Additionally, subsequent physical sensing mechanisms based on electrical, magnetic or optical effects may be influenced by thermal modulation provided by the present thermal oscillator in combination with lock-in techniques.

In a further embodiment, the device is embodied as a switching device. The efficiency of thermally driven switching devices, such as optical modulators based on refractive index changes, in particular in photonics and in optoelectronics, may be enhanced by the present thermal oscillator. Mechanical oscillators based on temperature-driven shape memory effects or piezoelectric effects may be used in applications of MEMS/NEMS technology, in particular when electrical currents are not applicable.

In a further embodiment, the device is embodied as a clocking device. A clocking device may be used for thermal logic circuitry. As described in reference [6], thermal logic holds the promise to scale to the theoretical limits of energy-efficient computing, because limits of heat flow are directly linked to limits of information and entropy flow (see reference [7]). In this context, the present thermal oscillator may act as a fundamental building block by acting as a temperature clocking device or as a frequency generator that does not rely on conventional Joule heating.

According to an embodiment of a third aspect of the invention there is provided a method for creating an oscillating heat flux from a stationary spatial thermal gradient between a warm reservoir and a cold reservoir, the method comprising:
conducting a heat flux from the warm reservoir towards the cold reservoir by means of a thermal conductor which is thermally connected to the warm reservoir and/or to the cold reservoir,
receiving the heat flux by a thermal switch which is coupled to the thermal conductor and which has two different states of thermal conductance,
creating an oscillating heat flux from the received heat flux by means of thermal relaxation oscillations of the thermal switch.

Any embodiment of one aspect of the invention may be combined with any embodiment of the other aspects of the invention.

In the following, exemplary embodiments of the present invention are described with reference to the enclosed figures.

BRIEF DESCRIPTION OF THE DRAWINGS

Similar or functionally similar elements in the figures have been allocated the same reference signs if not otherwise indicated.

DETAILED DESCRIPTION OF THE EMBODIMENTS

Figure 1:
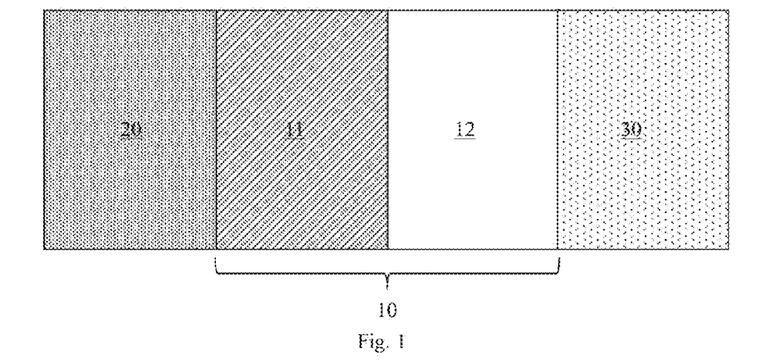
FIG. 1 shows a schematic block diagram of a first embodiment of a thermal oscillator for creating an oscillating heat flux.

In FIG. 1, a schematic block diagram of a first embodiment of a thermal oscillator 10 for creating an oscillating heat flux from a stationary spatial thermal gradient between a warm reservoir 20 and a cold reservoir 30 is depicted.

The thermal oscillator 10 comprises a thermal conductor 11 and a thermal switch 12. The thermal conductor 11 is configured to contact a heat flux from the warm reservoir 30 towards the cold reservoir 20.

The thermal switch 12 is coupled to the thermal conductor 11. In particular, the thermal switch 12 is connected to the thermal conductor 11. The thermal switch 12 is configured to receive the heat flux conducted by the thermal conductor 11. The thermal switch 12 has a certain difference between two states S1, S2 of thermal conductance, (see FIG. 8) for example due to metal-insulator phase transitions. In combination with the thermal conductor 11, alternating phase transitions are created leading to thermal relaxations such that the oscillating heat flux is created from the received heat flux.

The thermal switch 12 consists of a switching material showing single domain behavior, to avoid a gradual phase transition through the switching material. To ensure a complete switching of the switching material, the geometrical dimension of the switching material is restricted. The thickness that is smaller than 100 nm, in particularly, the switching material is between 10 nm and 100 nm.

Figure 2:
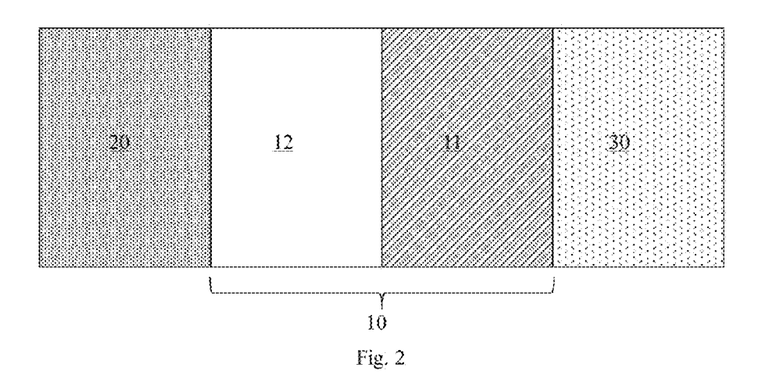
FIG. 2 shows a schematic block diagram of a second embodiment of a thermal oscillator for creating an oscillating heat flux.

In FIG. 2, a second embodiment of a thermal oscillator 10 is shown. The second embodiment of FIG. 2 is based on the first embodiment of FIG. 1, but the thermal conductor 11 is connected to the cold reservoir 30 and the thermal switch 12 is connected to the warm reservoir 20 and the thermal conductor 11. In this configuration, the switching direction of the thermal switch 12 is inverted to the case of the first embodiment of FIG. 1 (see FIG. 9). The thermal switch 12 is switching from a state of higher thermal conductance S1 at lower temperatures T1 to a state of lower thermal conductance S2 at higher temperatures T2.

Figure 3:
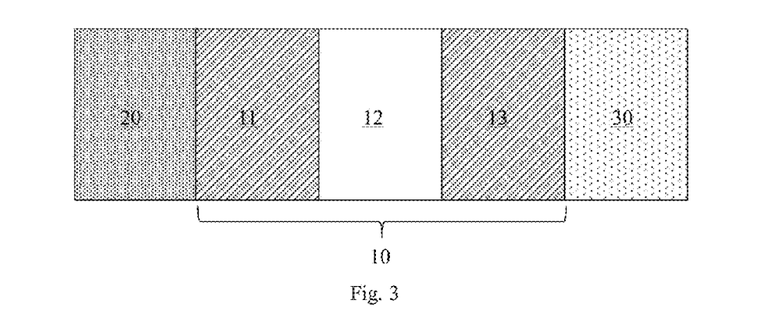
FIG. 3 shows a schematic block diagram of a third embodiment of a thermal oscillator for creating an oscillating heat flux comprising two thermal conductors.

In FIG. 3, a third embodiment of a thermal oscillator 10 is shown. The third embodiment of FIG. 3 is based on the first and second embodiments of FIG. 1 and FIG. 2, but comprises a further thermal conductor 13. In the third embodiment of FIG. 3, the thermal switch 12 is sandwiched between the first thermal conductor 11 and the second thermal conductor 13 which is connectable to the cold reservoir 30.

Figure 4:
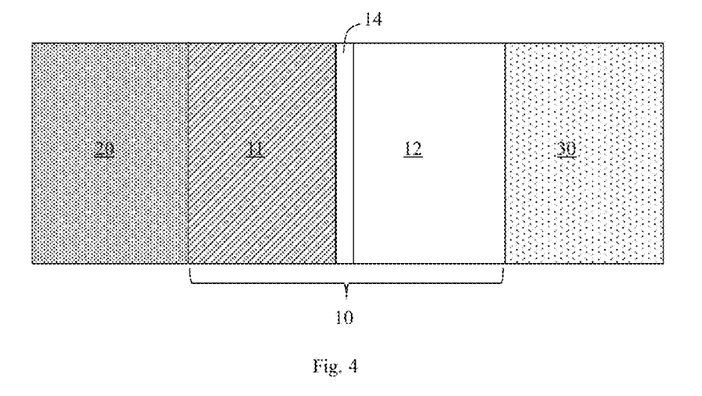
FIG. 4 shows a schematic block diagram of a fourth embodiment of a thermal oscillator for creating an oscillating heat flux comprising a vacuum gap.

In FIG. 4, a fourth embodiment of a thermal oscillator 10 is shown. The fourth embodiment of FIG. 4 is based on the first embodiment of FIG. 1. Additionally, the thermal oscillator 10 of FIG. 4 has a vacuum gap 14 which is arranged between the thermal conductor 11 and the thermal switch 12.

Figure 5:
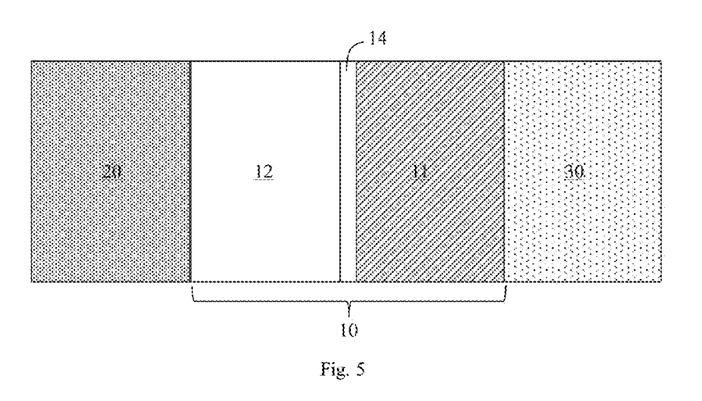
FIG. 5 shows a schematic block diagram of a fifth embodiment of a thermal oscillator for creating an oscillating heat flux comprising a vacuum gap.

In FIG. 5, a fifth embodiment of a thermal oscillator 10 is shown. The fifth embodiment of FIG. 5 is based on the second embodiment of FIG. 2. Additionally, the thermal oscillator 10 of FIG. 5 has a vacuum gap 14 which is arranged between the thermal conductor 11 and the thermal switch 12.

Figure 6:
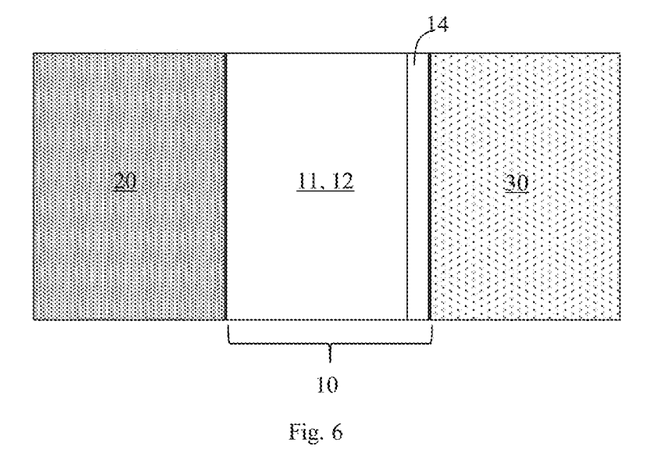
FIG. 6 shows a schematic block diagram of a sixth embodiment of a thermal oscillator for creating an oscillating heat flux.

In FIG. 6, a sixth embodiment of a thermal oscillator 10 is shown. The sixth embodiment of FIG. 6 is based on the first embodiment of FIG. 1. In FIG. 6, the entity 11, 12 includes the functionality of the thermal conductor 11 and the thermal switch 12. In particular, the entity 11, 12 may be embodied by one single layer. Further and for example, the vacuum gap 14 may act as thermal switch while the switching layer itself, having orders of magnitudes smaller change in thermal conductance acts mainly as thermal conductor.

Figure 7:
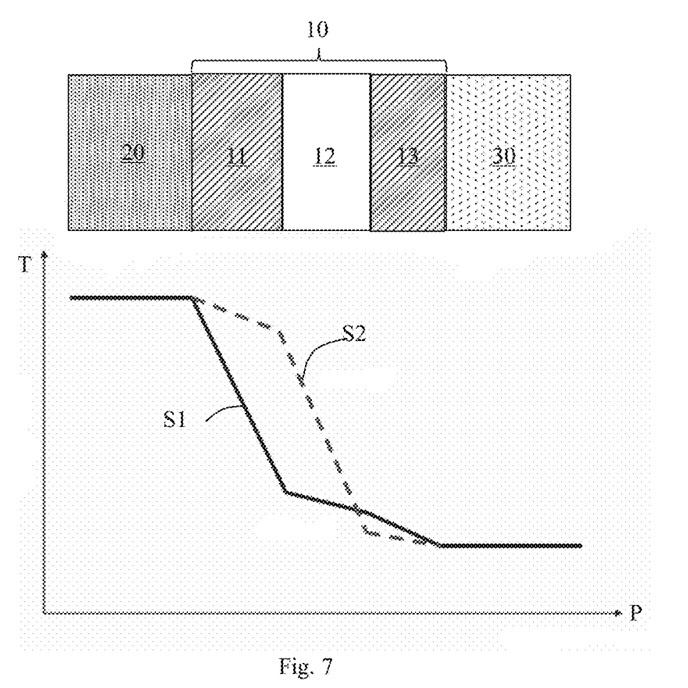
FIG. 7 shows a schematic block diagram of a third embodiment of a thermal oscillator for creating an oscillating heat flux and corresponding stationary temperature profiles for two states slightly above and below the switching temperature interval, respectively.

FIG. 7 shows a schematic block diagram of the third embodiment of a thermal oscillator 10 for creating an oscillating heat flux from a stationary spatial thermal ingredient between a warm reservoir 20 and a cold reservoir 30 and corresponding temperature profiles for the oscillator being in a stationary state slightly below and above the switching temperature interval H The temperature T is shown as a function of position P along the thermal oscillator 10 for two possible stationary states. FIG. 7 shows that depending on the state S1 or S2 of the thermal switch 12 of the thermal oscillator 10, the temperature distribution T along the thermal oscillator 10 changes approaching the two "idle" steady states S1, S2, given by the relative thermal conductance values of the thermal switch 12 and the thermal conductors 11, 13.

Figure 8:
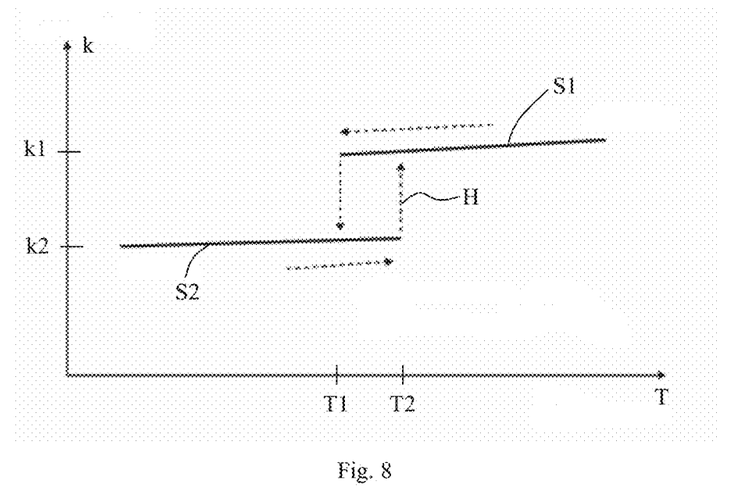
FIG. 8 shows the thermal conductance of a thermal switch as a function of temperature as suitable for the thermal oscillator configuration of the first embodiment.

In FIG. 8, the conductance k of the thermal switch 12 of FIG. 1 as a function of temperature T is depicted. The thermal switch 12 is configured to switch at a first switching temperature T1 from a first state S1 in which the thermal switch has a first thermal conductance k1 to a second state S2 in which the thermal switch 12 has a second thermal conductance k2. The first thermal conductance k1 and the second thermal conductance k2 are different values between the thermal switch 12 switches according to the hysteresis H. The first thermal conductance k1 may be a constant or nearly a constant slightly and linearly changing with temperature T. In an analogous way, the second thermal conductance k2 may be a smaller constant or nearly a constant also slightly and linearly changing with temperature T. At the second switching temperature T2, the thermal switch 12 switches from the second state S2 to the first state S1 according to the hysteresis H. The hysteresis H describes the temperature-driven phase transitions in the thermal switch 12.

Further, the first and the second switching temperatures T1, T2 of the thermal switch 12 lie between the temperature of the warm reservoir 20 and the temperature of the cold reservoir 30 (see FIGS. 1 and 2).

Hereby, the thermal switch 12 may be configured to undergo the metal-insulator phase transitions in time intervals, which are smaller than nanoseconds, preferably smaller than picoseconds. Thereby the thermal conductance of the thermal switch changes faster than the thermal equilibration time or thermal conductance of the thermal conductor.

Moreover, the thermal conductance of the thermal conductor 11 as shown in FIGS. 1 and 2 is preferable between the first conductance k1 and the second conductance k2 of the thermal switch 12 to achieve a large temperature swing.

Figure 9:
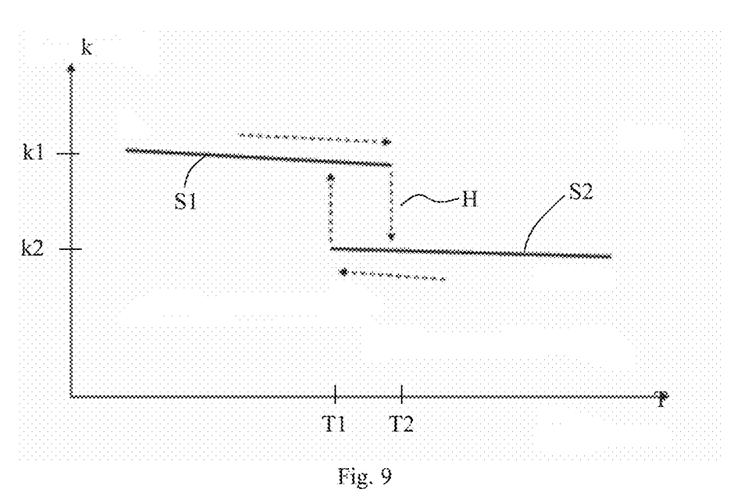
FIG. 9 shows the thermal conductance of a thermal switch as a function of temperature as suitable for the thermal oscillator of the second embodiment.

FIG. 9 shows the thermal conductance of a thermal switch 12 as a function of temperature as suitable for the thermal oscillator 10 of the second embodiment.

Figure 10:
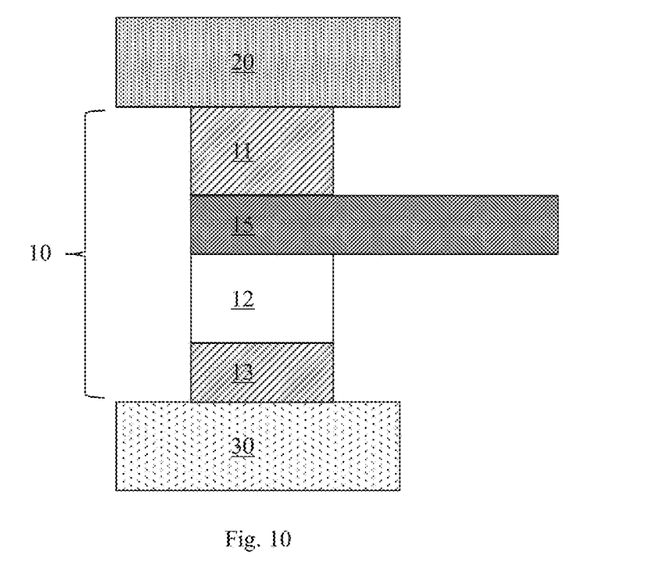
FIG. 10 shows a schematic block diagram of a seventh embodiment of a thermal oscillator for creating an oscillating heat flux, where a thermal electrode is attached.

In FIG. 10, a schematic block diagram of a seventh embodiment of a thermal oscillator 10 for creating an oscillating heat flux is shown. Additionally to the third embodiment of FIG. 3, the seventh embodiment of the thermal oscillator 10 of FIG. 10 comprises a thermal electrode 15. The thermal electrode 15 may be attached to the thermal conductor 11 and/or to the thermal switch 12 such that the created oscillating heat flux is receivable at an external device. The thermal electrode 15 may include a metal sheet for gripping the created oscillating heat flux.

Figure 11:
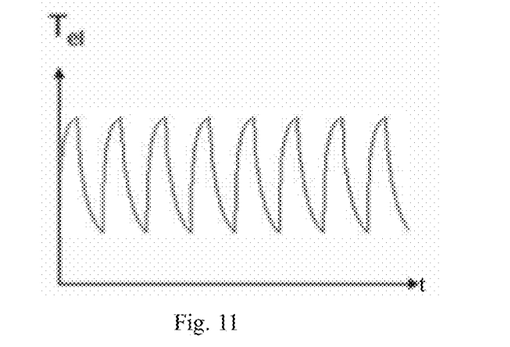
FIG. 11 shows the temperature oscillation at the thermal electrode attached to the thermal oscillator of FIG. 10.

In this regard, FIG. 11 shows the oscillating temperature Tel at the thermal electrode 15 of the thermal oscillator 10 of FIG. 10 as a function of time t.

Figure 12:
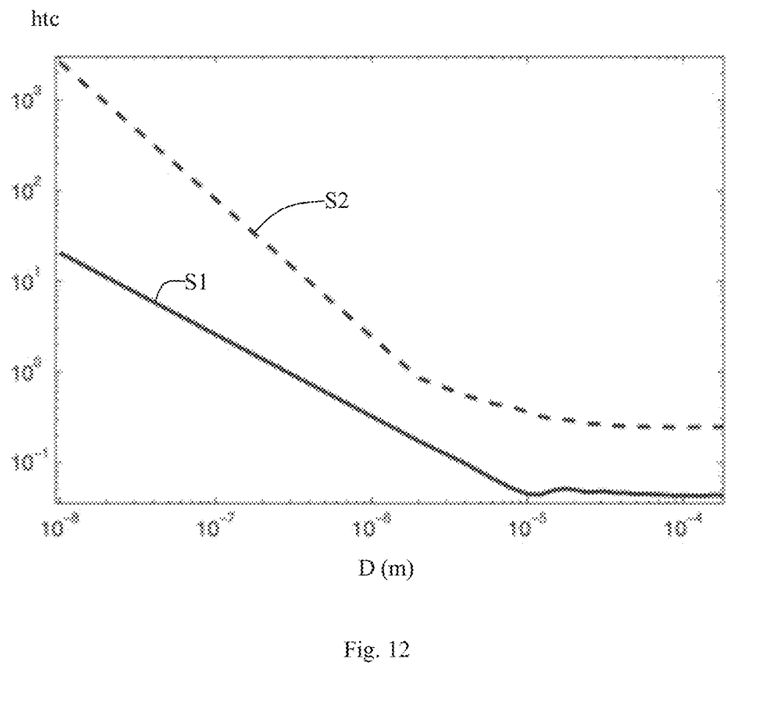
FIG. 12 shows the heat transfer coefficient for the two states of a thermal oscillator as a function of the width of the vacuum gap.

Furthermore, FIG. 12 shows the heat transfer coefficient htc between a thermal switch and a thermal conductor for the two states S1, S2 of the thermal oscillator 10 of FIG. 4 as a function of the width D of the vacuum gap 14.

From FIG. 12, it may be clear that may be advantageous to control and maintain the distance D between the two boundary surfaces of the vacuum gap 14.

Figure 13:
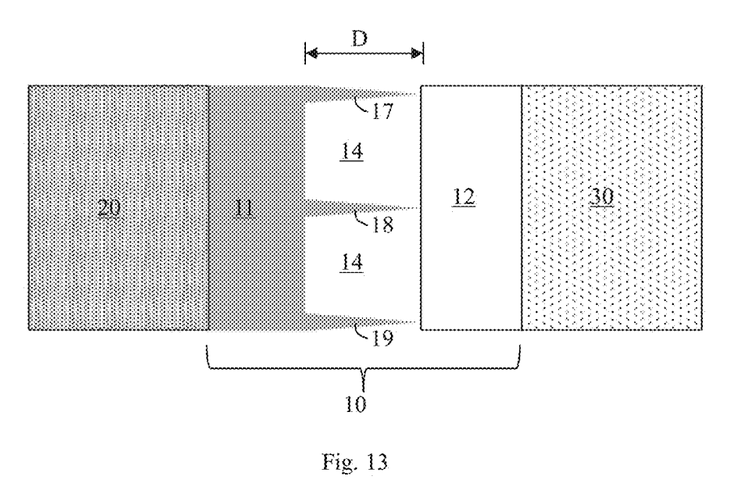
FIG. 13 shows a schematic block diagram of a eighth embodiment of a thermal oscillator for creating an oscillating heat flux.

For this reason, a structure as shown in FIG. 13 may be implemented. In detail, FIG. 13 shows a schematic block diagram of an eighth embodiment of a thermal oscillator 10 for creating an oscillating heat flux.

In said eighth embodiment of FIG. 13, the thermal conductor 11 includes a plurality of spacers 17, 18, 19 for defining a certain distance D between said two boundary surfaces of the thermal conductor 11 and the thermal switch 12. Without loss of generality, FIG. 13 only shows three spacers 17, 18, 19. Practically, there may be a very large number of such spacers 17, 18, 19. For example, the spacers 17, 18, 19 are embodied by a defined rough surface of said thermal conductor 11. The spacers 17, 18, 19 may have a needle-like shape. Moreover, the spacers 17, 18, 19 may contribute only little to the overall thermal transport from the thermal conductor 11 to the thermal switch 12.

Figure 14:
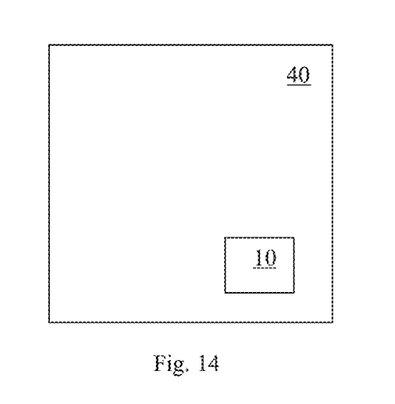
FIG. 14 shows a schematic block diagram of device including a thermal oscillator for creating an oscillating heat flux.

FIG. 14 shows a schematic block diagram of a device 40 including a thermal oscillator 10 for creating an oscillating heat flux. The thermal oscillator 10 of FIG. 14 may be embodied as one of the eight embodiments of the thermal oscillator 10 described with reference to FIGS. 1-13. The device 40 of FIG. 14 may be an energy-harvesting device, a sensing device, a switching device or a clocking device.

More generally, while the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims.

REFERENCE SIGNS 10 thermal oscillator
11 thermal conductor
12 thermal switch
13 thermal conductor
14 vacuum gap
15 thermal electrode
17 spacer
18 spacer
19 spacer
D distance
H hysteresis
htc heat transfer coefficient
k thermal conductance
P position
S1 first state of the thermal switch
S2 second state of the thermal switch
T temperature
T1 first switching temperature
T2 second switching temperature
t time

REFERENCES

[1] H. Wong et al., Proc. IEEE, 2010: THERMAL TRANSISTOR: HEAT FLUX SWITCHING AND MODULATING; Source: arXiv: 0803.2942, 20 Mar. 2008; Authors: Wei Chung Lo, Lei Wang and Baowen Li.
[2] INFLUENCE OF ROUGHNESS ON NEAR-FIELD HEAT TRANSFER BETWEEN TWO PLATES; Source: Phys. Rev. B 82, 245410 (2010); Authors: S.-A. Biehs and J.-J. Greffet.
[3] P. J. van Zwol, PHONON POLARITONS ENHANCE NEAR-FIELD THERMAL TRANSFER ACROSS THE PHASE TRANSITION OF VO2, Phys. Rev. B 84, 161413(R), 2011.
[4] Imada et al., Reviews of Modern Physics, Vol. 70, No. 4, October 1998.
[5] G. Sebald et al., ON THERMOELECTRIC AND PYROELECTRIC ENERGY HARVESTING, SMART MATER, Struct. 18, 2009, 125006
[6] L. Wang and B. Li, PHONONICS GETS HOT, Physicsworld 3, 2008, pp 27-29
[7] J. B. Pendry, QUANTUM LIMITS TO THE FLOW OF INFORMATION AND ENTROPY, J. Phys. A: Math. Gen. 16 (1983) 2161-2171

The invention claimed is:

1. A thermal oscillator (10) for creating an oscillating heat flux from a stationary spatial thermal gradient between a warm reservoir (20) and a cold reservoir (30), the thermal oscillator (10) comprising:
a thermal conductor (11) which is connectable to the warm reservoir (20) or to the cold reservoir (30) and configured to conduct a heat flux from the warm reservoir (20) towards the cold reservoir (30), and
a thermal switch (12) coupled to the thermal conductor (11) for receiving the heat flux and having two different states (S1, S2) of thermal conductance for providing thermal relaxation oscillations such that the oscillating heat flux is created from the received heat flux, wherein the thermal oscillator (10) is embodied as a solid-state thermal oscillator (10).

2. The thermal oscillator of claim 1, wherein the thermal switch (12) is sandwiched between the thermal conductor (11) and a further thermal conductor (13) which is connectable to the cold reservoir (30).

3. The thermal oscillator of claim 1, wherein a vacuum gap (14) is arranged between the thermal conductor (11) and the thermal switch (12).

4. The thermal oscillator of claim 3, wherein the vacuum gap (14) has a width between 1 nm and 200 nm.

5. The thermal oscillator of claim 1, wherein the thermal switch (12) is configured to switch at a first switching temperature (T1) from a first state (S1) of the two states (S1, S2) in which the thermal switch (12) has a first thermal conductance (k1) to a second state (S2) of the two states (S1, S2) in which the thermal switch (12) has a second thermal conductance (k2), and wherein the thermal switch (12) is configured to switch at a second switching temperature (T2) from the second state (S2) to the first state (S1).

6. The thermal oscillator of claim 1, wherein the thermal switch (12) is configured such that its two different states (S1, S2) of thermal conductivity are adapted to provide periodic metal-insulator phase transitions leading to the thermal relaxation oscillations such that the oscillating heat flux is created from the received heat flux.

7. The thermal oscillator of claim 5, wherein the first and the second switching temperatures (T1, T2) of the thermal switch (12) lie between a temperature of the warm reservoir (20) and a temperature of the cold reservoir (30).

8. The thermal oscillator of claim 6, wherein the thermal switch (12) is configured to undergo the periodic metal-insulator phase transitions in time intervals which are smaller than a thermal equilibration time or thermal time constant of the thermal conductor (11).

9. The thermal oscillator of claim 6, wherein a switching material of the thermal switch (12) is configured to have single domain behaviour during the phase transitions.

10. The thermal oscillator of claim 9, wherein the switching material has a thickness between 10 nm and 100 nm.

11. The thermal oscillator of claim 9, wherein a lateral dimension of the switching material is restricted such that single domain behaviour during the phase transitions is ensured.

12. The thermal oscillator of claim 1, wherein the thermal conductance of the thermal conductor (11) is between a first magnitude (k1) of thermal conductance of the thermal switch (12) in its first state (S1) and a second magnitude (k2) of thermal conductance of the thermal switch (12) in its second state (S2).

13. The thermal oscillator of claim 1, wherein the thermal conductor (11) includes a pyroelectric material configured for energy harvesting upon cycling its temperature.

14. The thermal oscillator of claim 1, wherein a thermal electrode (15) is attached to the thermal conductor (11) or to the thermal switch (12) such that the created oscillating heat flux is receivable at an external device.

15. The thermal oscillator of claim 1, wherein the thermal conductor (11) has a plurality of spacers (17, 18, 19) for defining a certain distance (D) to the thermal switch (12).

16. The thermal oscillator of claim 1, wherein the thermal switch (12) includes at least one of the following switching materials:
vanadium(II)-oxide, titanium-doped vanadium(III)-oxide, silicon-phosphor, silicon-arsenic, silicon-boron, silicon gallium.

17. The thermal oscillator of claim 1, wherein the thermal conductor (11) includes silicon-dioxide.

18. A device (40) comprising at least one thermal oscillator (10), the thermal oscillator for creating an oscillating heat flux from a stationary spatial thermal gradient between a warm reservoir (20) and a cold reservoir (30), the thermal oscillator (10) comprising:
a thermal conductor (11) which is connectable to the warm reservoir (20) or to the cold reservoir (30) and configured to conduct a heat flux from the warm reservoir (20) towards the cold reservoir (30), and
a thermal switch (12) coupled to the thermal conductor (11) for receiving the heat flux and having two different states (S1, S2) of thermal conductance for providing thermal relaxation oscillations such that the oscillating heat flux is created from the received heat flux, wherein said at least one thermal oscillator (10) is embodied as a solid-state thermal oscillator (10).

19. The device of claim 18, wherein the device (40) is embodied as an energy harvesting device, as a sensing device, as a switching device or as a clocking device.

20. A method for creating an oscillating heat flux from a solid-state thermal oscillator (10) providing a stationary spatial thermal gradient between a warm reservoir (20) and a cold reservoir (30), the method comprising:
conducting a heat flux from the warm reservoir (20) towards the cold reservoir (30) by means of a thermal conductor (11) which is thermally connected to the warm reservoir (20) and/or to the cold reservoir (30),
receiving the heat flux by a thermal switch (12) which is coupled to the thermal conductor (11) and which has two different states (S1, S2) of thermal conductance, and
creating an oscillating heat flux from the received heat flux by means of thermal relaxation oscillations of the thermal switch.

* * * * *